United States Patent
Ozawa

(10) Patent No.: US 7,256,383 B2
(45) Date of Patent: Aug. 14, 2007

(54) OPTICAL SENSOR CIRCUIT, METHOD OF PROCESSING OUTPUT SIGNAL OF THE SAME, AND ELECTRONIC APPARATUS

(75) Inventor: Tokuro Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 11/103,480

(22) Filed: Apr. 12, 2005

(65) Prior Publication Data

US 2005/0269487 A1   Dec. 8, 2005

(30) Foreign Application Priority Data

Jun. 3, 2004 (JP) .............................. 2004-165780

(51) Int. Cl.
*G01J 1/44* (2006.01)
*H04N 9/64* (2006.01)
(52) U.S. Cl. .................. 250/214 C; 348/243; 348/245
(58) Field of Classification Search ............ 250/214 C; 348/243, 245
See application file for complete search history.

(56) References Cited

U.S. PATENT DOCUMENTS 6,043,892 A       3/2000  Park
2003/0122060 A1*  7/2003  Nixon et al. ............. 250/214 C

FOREIGN PATENT DOCUMENTS

| JP | A-59-128415 | 7/1984 |
| JP | A-09-082931 | 3/1997 |
| KR | 1999-047769 | 6/1999 |

\* cited by examiner

*Primary Examiner*—Georgia Epps
*Assistant Examiner*—Brian J Livedalen
(74) *Attorney, Agent, or Firm*—Oliff & Berridge, PLC

(57) ABSTRACT

An optical sensor circuit has a first optical sensor that outputs a signal according to the amount of received light on an opened light-receiving surface, a second optical sensor that is provided near the first optical sensor and outputs a signal according to the amount of received light on a shielded light-receiving surface, and a difference calculating circuit that calculates a difference between the output signal of the first optical sensor and the output signal of the second optical sensor and outputs the difference.

4 Claims, 5 Drawing Sheets

OPTICAL SENSOR CIRCUIT, METHOD OF PROCESSING OUTPUT SIGNAL OF THE SAME, AND ELECTRONIC APPARATUS

BACKGROUND OF THE INVENTION

1. Technical Field

The present invention relates to a technique which reads an output of a light-receiving element such as a photodiode.

2. Related Art

In recent years, a display panel in which liquid crystal elements or organic EL elements are arranged in a matrix shape has been widely been used for an electronic apparatus such as a cellular phone, a personal digital assistant, or the like. The display panel is used under various circumstances, for example, under bright conditions where there is sufficient sunlight, that is, daytime, or under dark conditions where external light is insufficient, that is, night. For this reason, when brightness or image quality of a display element is constant irregardless of external light, there is an inconsistency in that, while the display panel can be easily viewed under some conditions, it can hardly be viewed under other conditions. Accordingly, in such a display panel, it is preferable to detect external light and control the brightness or image quality according to the detection result.

In such a control, a light-receiving element such as a photodiode is used to detect external light. In this case, however, if the light-receiving element is provided separately from the display panel, a space for mounting the light-receiving element is required extra in the electronic apparatus. Further, an opening portion needs to be provided in the light-receiving element to detect external light.

As a countermeasure against the above-described problems, a technique in which, in the display panel, light-receiving elements are formed by using the same process as that of a thin film transistor (hereafter, suitably referred to as 'TFT') for switching a pixel in the display panel, such that the display panel itself detects external light, has been proposed.

In this technique, the detection precision of light amount is degraded due to the noise mixed into an output line. Accordingly, a technique in which the noise present on the output line is detected and the detected noise is supplied to the output line after being inverted, such that the noise present on the output line is corrected, has been proposed (see Japanese Unexamined patent Application Publication No. 9-82931 (FIG. 1)).

However, when the light-receiving element is formed with the same process as that of the thin film transistor for switching the pixel in the display panel, the detection precision of light amount is degraded due to the noise or dark current by the light-receiving element itself.

SUMMARY

An advantage of the invention is that it provides an optical sensor circuit which can prevent detection precision from deteriorating due to noise or dark current by a light-receiving element itself, a method of processing an output signal of the optical sensor circuit, and an electronic apparatus.

According to an aspect of the invention, there is an optical sensor circuit including a first optical sensor that outputs a signal according to the amount of received light on an opened light-receiving surface, a second optical sensor that is provided near the first optical sensor and outputs a signal according to the amount of received light on a shielded light-receiving surface, and a difference calculating circuit that calculates a difference between the output signal of the first optical sensor and the output signal of the second optical sensor and outputs the difference. According to this optical sensor circuit, the output signal of the second optical sensor that is provided near the first optical sensor is detected as a reference signal of noise or dark current generated in the first optical sensor. The reference signal is subtracted from the output signal of the first optical sensor and the subtraction result is output as a differential value. For this reason, an influence on the differential value by the noise or the dark current is eliminated and thus degradation in detection precision is prevented.

In the optical sensor circuit, it is preferable that the first and second optical sensors output logical signals having pulse widths according to the amounts of received light respectively and the difference calculating circuit has an EX-OR circuit that calculates an exclusive logical sum signal of the output signal of the first optical sensor and the output signal of the second optical sensor. According to this configuration, since the difference calculating circuit can be configured with a logical circuit, the configuration can be simplified.

In addition, in this configuration, since information about the pulse width of the output signal of the second optical sensor is stored in a memory or the like and is read from the memory, the second optical sensor needs to be operated at all times. At this time, the information about the pulse width of the output signal of the second optical sensor may be updated at a constant interval.

Besides, the invention can be conceptualized as a method of processing of an output signal of the optical sensor circuit, as well as the optical sensor circuit. Furthermore, since an electronic apparatus according to another aspect of the invention has the above-described optical sensor circuit, a display unit can be controlled more correctly by the differential value.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, an embodiment according to the invention will be described with reference to the drawings.

Figure 1:
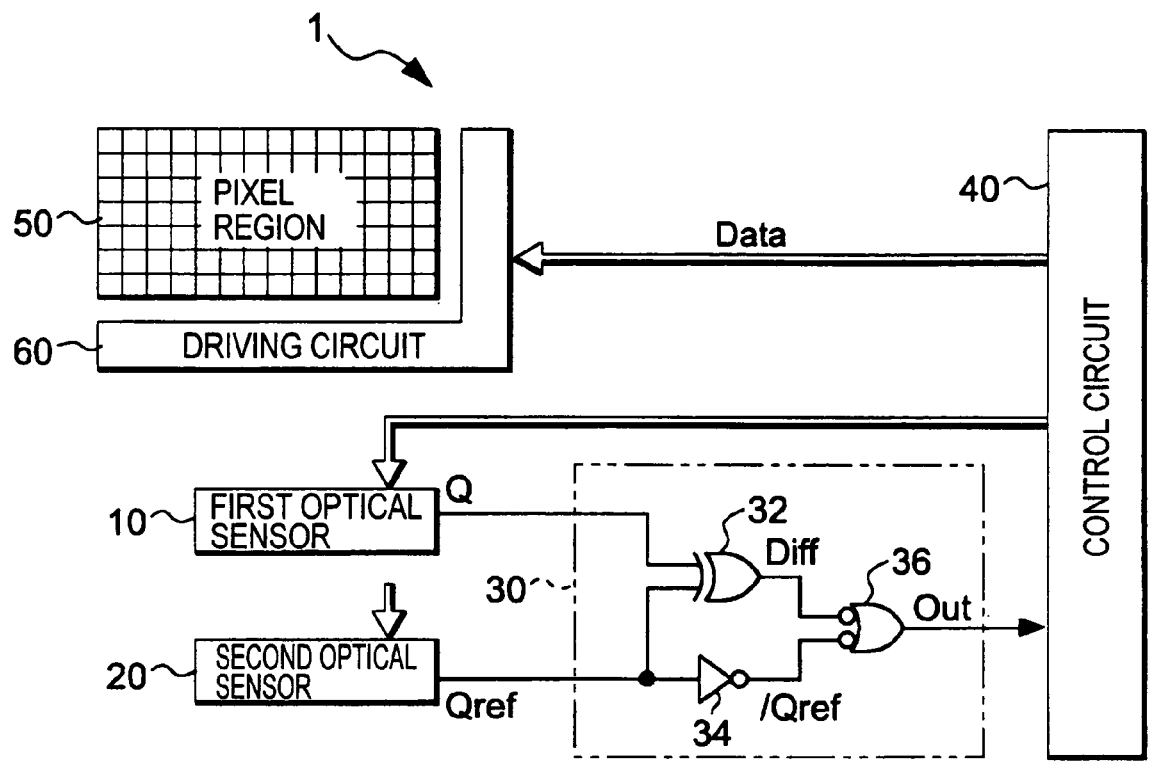
FIG. 1 is a diagram showing a configuration of a liquid crystal display panel to which an optical sensor circuit according to an embodiment of the invention is applied.

FIG. 1 is a block diagram showing the overall configuration of a liquid crystal display panel which has an optical sensor circuit according to an embodiment of the invention.

Figure 2:
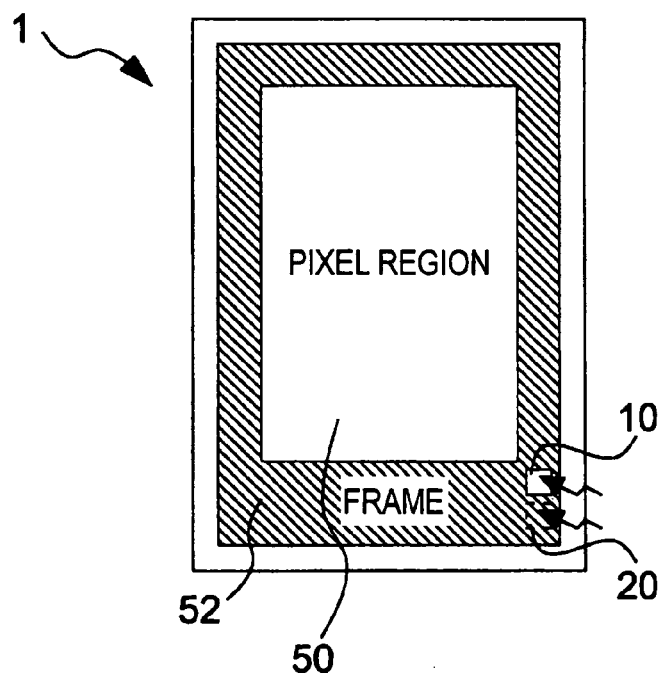
FIG. 2 is a plan view showing an arrangement of sensors in the liquid crystal display panel.

In FIG. 1, a first optical sensor 10 and a second optical sensor 20 output signals Q and Qref according to the amounts of received light, respectively. In the embodiment, the larger the amounts of received light received by the first optical sensor 10 and the second optical sensor 20, the smaller the pulse widths of Q and Qref are. The details will be described later. The first optical sensor 10 and the second optical sensor 20 are formed to be adjacent to each other on a region of the liquid crystal display panel 1 which corresponds to a frame 52 serving as a light-shielding layer which partitions an outer circumferential edge of a pixel region 50, as shown in FIG. 2. The first optical sensor 10 is provided in a portion where the frame 52 is opened and the second optical sensor 20 is provided in a portion where light is shielded by the frame 52.

In addition, the pixel region 50 is a region where pixels are arranged in a matrix shape. As well known in the related art, the pixels are provided to correspond to intersections of scanning lines (not shown) and data lines (not shown). Each pixel has a TFT which is turned on between the data line and a pixel electrode when the scanning line is selected and a liquid crystal layer in which liquid crystal is interposed between the pixel electrode and a counter electrode (common electrode). The detailed configuration of the pixel has no relation to the invention and thus the description thereof will be omitted.

A difference calculating circuit 30 has an EX-OR circuit 32 which calculates an exclusive logical sum of the signal Q and the signal Qref and outputs the calculation result as a signal Diff, a NOT circuit 34 which inverts the logical level of the signal Qref and outputs the inverted result as a signal /Qref, and an NAND circuit 36 which calculates an inverted logical product of the signal Diff and the signal /Qref and outputs the result as a signal Out. Moreover, / is used as a symbol indicating the inversion of the signal.

A control circuit 40 processes data Data indicating gray scale levels of the respective pixels in the pixel region 50 according to the pulse width of the signal Out and supplies the process result to a driving circuit 60. Further, the control circuit 40 adjusts the luminance of an auxiliary light source such as a backlight or supplies control signals described later to the first optical sensor 10 and the second optical sensor 20 respectively.

The driving circuit 60 is the general term for circuits for driving the above-described scanning lines and data lines. Specifically, the driving circuit 60 has a scanning line driving circuit for sequentially selecting the scanning lines and a data line driving circuit for supplying data signals of voltages according to the gray scale levels to the pixels on the selected scanning line via data lines. Here, the detailed configuration of the driving circuit has no relation to the invention and thus the description thereof will be omitted.

Figure 3:
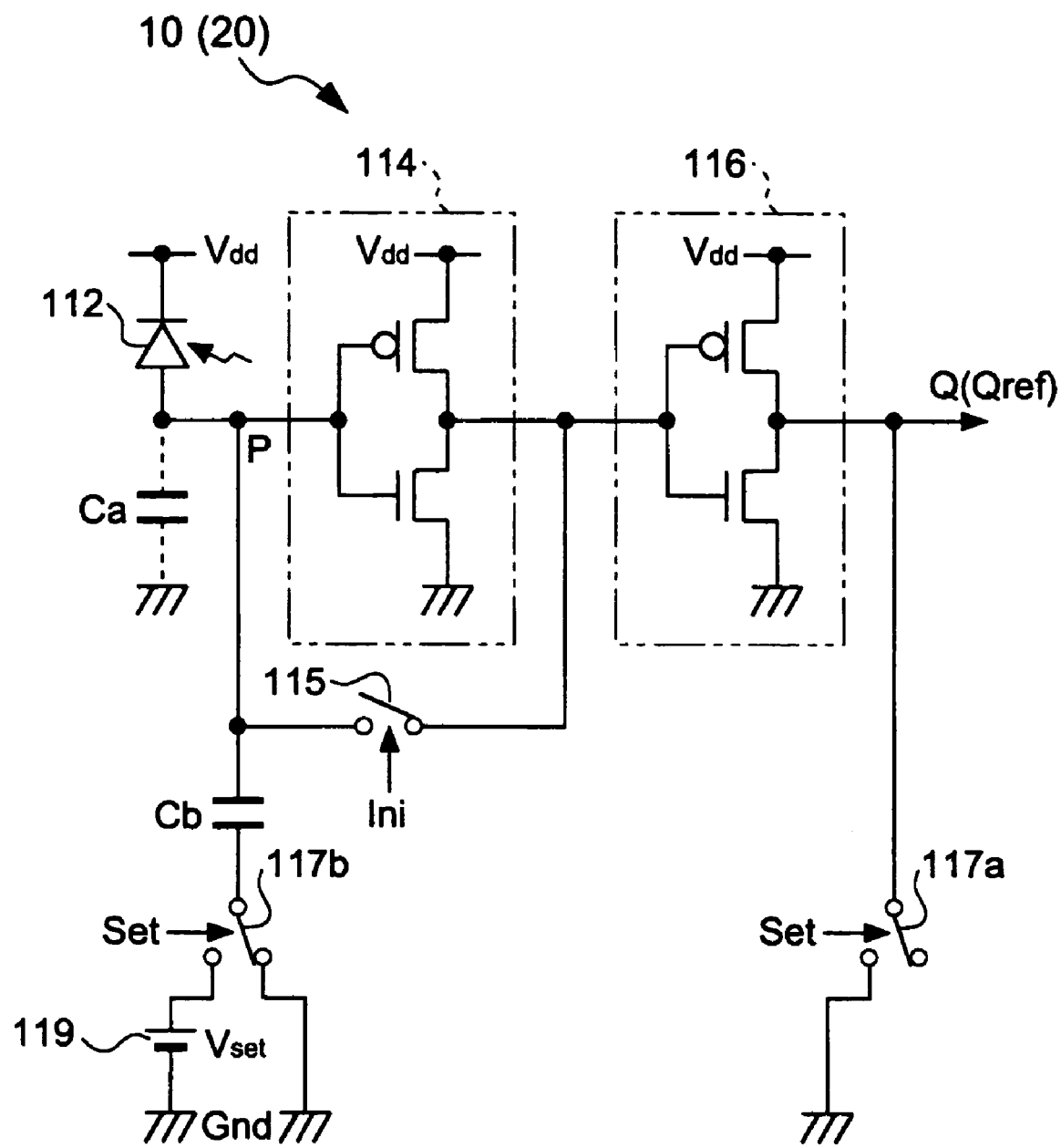
FIG. 3 is a diagram showing an example of a configuration of a first or second optical sensor.

Next, the detailed configurations of the first optical sensor 10 and the second optical sensor 20 will be described by way of the first optical sensor 10. FIG. 3 is a circuit diagram showing an electrical configuration of the first optical sensor 10.

As shown in FIG. 3, a cathode of a photodiode 112 is connected to a feeding line to which a high-level voltage Vdd of a power source is supplied, and an anode of the photodiode 112 is connected to an input terminal of an inverter circuit 114, one end of a switch 115, and one end of a capacitance Cb respectively. Here, as described above, a light-receiving surface of the photodiode 112 is provided in an opening portion of the frame 52. The photodiode 112 is, for example, a PIN type and is formed with the same process as that of the TFT for switching the pixel.

The inverter circuit 114 has a complementary configuration of a p-channel TFT and an n-channel TFT that has a voltage (Vdd−Gnd) as a power source. A common gate of the p-channel TFT and the n-channel TFT serves as an input terminal of the inverter circuit 114 and a common drain of the p-channel TFT and the n-channel TFT serves as an output terminal of the inverter circuit 114. The output terminal of the inverter circuit 114 is connected to an input terminal of an inverter circuit 116 which has the same configuration as that of the inverter circuit 114. Then, a signal present on an output terminal of the inverter circuit 116 is output as Q.

In addition, the output terminal of the inverter circuit 116 is connected to a common terminal of a switch 117a. Here, the switch 117a is a double-throw switch. When a control signal Set supplied from a control circuit 40 (see FIG. 1) is at the L level, the switch 117a is switched to a position as shown by the solid line in FIG. 3, and when the control signal Set is at the H level, the switch 117a is switched to a reference potential Gnd.

Therefore, when the control signal Set is at the L level, the voltage level of the signal Q is determined by the voltage on the input terminal of the inverter circuit 116, and, when the control signal Set is at the H level, the voltage level of the signal Q becomes the L level.

On the other hand, the output terminal of the inverter circuit 114 is connected to the other end of the switch 115 in addition to the input terminal of the inverter circuit 116. Here, when a control signal Ini supplied from the control circuit 40 becomes the H level, the switch 115 is turned on and, when the control signal Ini becomes the L level, the switch 115 is turned off.

In addition, the other end of the capacitance Cb is connected to a common output terminal of a switch 117b. Here, the switch 117b is a double-throw switch. When the control signal Set is at the L level, the switch 117b is switched to a position as shown by the solid line in FIG. 3 to select the reference potential Gnd of the voltage and, when the control signal Set is at the H level, the switch 117a selects a positive terminal of a reference voltage source 119 which supplies a voltage Vset. A negative terminal of the reference voltage source 119 is connected to the potential Gnd.

Further, for convenience of the description, the anode of the photodiode 112 (the input terminal of the inverter circuit 114, one end of the switch 115, and one end of the capacitance Cb) is referred to as a node P. As described above, since the first optical sensor 10 is formed in the liquid crystal display panel 1, significant parasitic capacitance is present on the node P. The parasitic capacitance is represented by Ca.

In addition, an electrical configuration of the second optical sensor 20 is the same as that of the first optical sensor 10 shown in FIG. 3. However, a light-receiving surface of the photodiode 112 is provided in a portion where light is shielded by the frame 52. Further, an output signal of the second optical sensor 20 is Qref.

Figure 4:
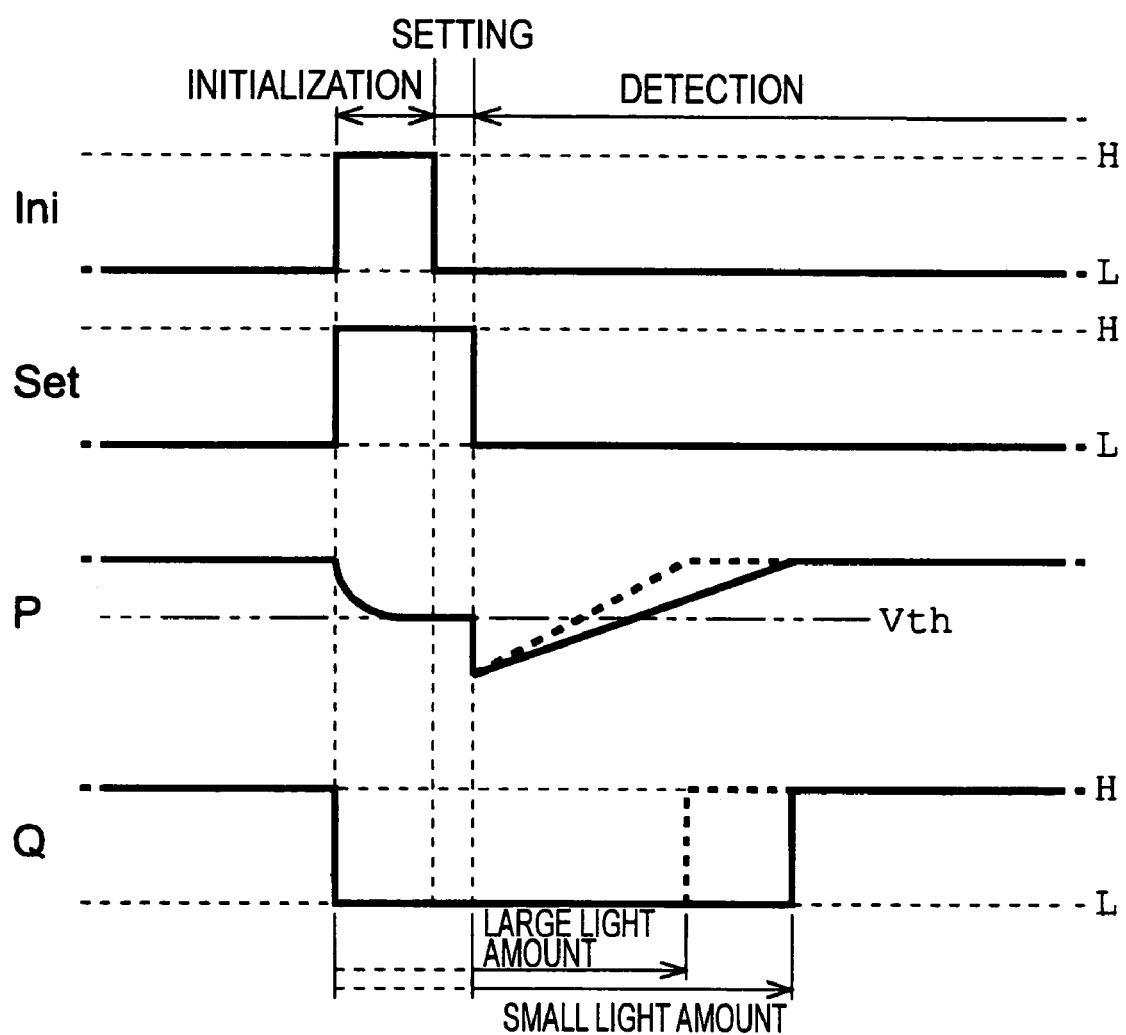
FIG. 4 is a diagram showing an operation of the first or second optical sensor.

Next, the operation of the first optical sensor 10 will be described with reference to FIG. 4.

First, in an initialization period, the control signals Ini and Set become the H level together by the control circuit 40. If the control signal Ini is at the H level, the switch 115 is turned on, and thus the node P is maintained at a threshold voltage Vth of the inverter circuit 114. That is, just before the initialization period, a voltage maintained by the parasitic capacitance Ca on the common gate of the TFTs of the inverter circuit 114 is initialized and maintained at the threshold voltage Vth. The threshold voltage is approximately (Vdd−Gnd)/2.

Further, if the control signal Set is at the H level, the switch 117b selects the positive terminal of the reference voltage source 119, and thus the other end of the capacitance Cb becomes the voltage Vset.

Subsequently, in a setting period, the control signal Ini is changed to the L level and the control signal Set is changed to the L level later than the control signal Ini.

When the control signal Set becomes the L level, the switch 117a selects the position shown by the solid line in FIG. 3. Therefore, a signal P depends on the voltage level of the node P.

Here, when the control signal Set becomes the L level, the switch 117b selects the potential Gnd. Therefore, the voltage at the other end of the capacitance Cb is dropped from the voltage Vset to the ground level. When the control signal Ini becomes L level, the switch 115 is turned off. Accordingly, the voltage of the node P is dropped by the value obtained by dividing the voltage drop on the capacitance Cb by the coupling ratio between the capacitances Ca and Cb.

In detail, when the control signal Set is changed to the L level, the voltage drop at the other end of the capacitance Cb is (Vset−Gnd). Therefore, the voltage of the node P is dropped from the threshold voltage Vth by (Vset−Gnd)·Ca/(Ca+Cb).

As a result, since the voltage of the node P is always lower than the threshold voltage Vth just after the control signal Set is changed to the L level, a signal Q which is obtained by inverting the logical level of the node P again is maintained at the L level.

Since a current according to the amount of received light flows in the photodiode 112 after the control signal Set is changed to the L level, the voltage of the node P rises from a point at which the voltage of the node P is dropped toward the voltage Vdd. When the voltage of the node P exceeds the threshold voltage Vth of the inverter circuit 114, the voltage on the output terminal of the inverter circuit 114 becomes the L level. Then, the voltage is inverted by the inverter circuit 116, and thus the signal Q becomes the H level.

At this time, the more the amount of received light, the larger the current flowing in the photodiode 112. Therefore, the voltage build-up rate of the node P is increased. As a result, the timing at which the signal Q is changed to the H level accordingly becomes faster.

When the control signal Set is changed to the L level, the voltage drop of the node P is constant. Therefore, a period until the signal Q is changed to the H level from the time when the control signal Set is changed to the L level corresponds to the amount of received light on the photodiode 112.

The timing at which the signal Q is changed to the L level is the timing at which the control signal Set is changed to the H level. In this case, if a period in which the control signal Set becomes the H level is constant, the pulse width, which is the period in which the signal Q is the L level, substantially corresponds to the amount of received light on the photodiode 112.

The second optical sensor 20 performs the same operation since the control signals Ini and Set are supplied at the same timing as that in the first optical sensor 10. However, since the light-receiving surface of the photodiode 112 in the second optical sensor 20 is shielded from light by the frame 52, the pulse width in which the output signal Qref of the second optical sensor 20 becomes the L level is longer than that of the signal Q, as shown in FIG. 5.

Figure 5:
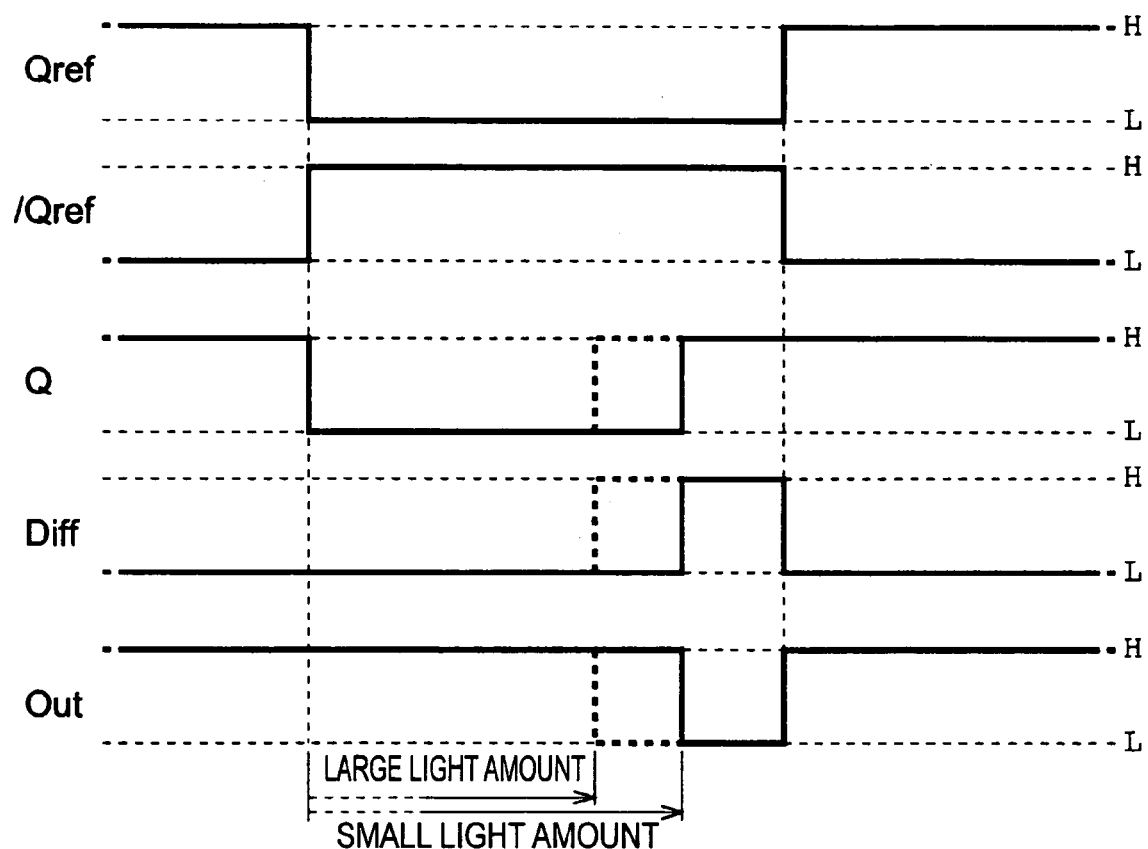
FIG. 5 is a diagram showing an operation of the optical sensor circuit.

Here, as shown in FIG. 5, when the signals Q and Qref are output, a signal Diff, which is an exclusive logical sum of the signals Q and Qref, is generated.

As described above, the signal Q from the first optical sensor 10 is output to have the pulse width according to the amount of received light on the photodiode 112. The signal Q having the pulse width is output without being influenced by the parasitic capacitance on the gate of the TFT as a part of the inverter circuit 114. However, the signal Q having the pulse width still includes the dark current of the photodiode 112, the noise, or the like. That is, the signal Q is still influenced by the dark current of the photodiode 112, the noise, or the like.

On the other hand, the second optical sensor 20 is provided near the first optical sensor 10 as shown in FIG. 2 and has the same electrical configuration as that of the first optical sensor 10. Further, the second optical sensor 20 is formed with the same process as that of the first optical sensor 10 and operates at the same timing as that of the first optical sensor 10. However, the second optical sensor 20 is different from the first optical sensor 10 depending on whether or not the light-receiving surface on the photodiode 112 is opened. Therefore, the signal Qref from the second optical sensor 20 will be influenced by the dark current, the noise or the like, similarly to the first optical sensor 10.

Therefore, in a different portion between the pulse width of the signal Q from the first optical sensor 10 and the pulse width of the signal Qref from the second optical sensor 20, that is, in the pulse width in which the signal Diff becomes the H level, the influence of dark current, noise or the like is excluded, and the portions according to the amount of received light are displayed more accurately.

Here, in the embodiment, the signal Diff is inverted by calculating an inverted logical-product to the signal /Qref with the NAND circuit 36 and the inverted signal is supplied to the control circuit 40 as the signal Out. For this reason, since the signal Out is substantially a signal which is obtained by logically inverting the signal Diff, the portion according to the amount of received light in the pulse width in which the signal Out becomes the L level is displayed more accurately. For this reason, the control circuit 40 that receives the signal Out can properly control a display content on the pixel region 50, an irradiation intensity of the backlight (auxiliary light source), and so on according to the amount of received light.

Moreover, since the start timing of the pulse width of the signal Qref from the above-described second optical sensor 20 corresponds to the start timing of the pulse width of the signal Q from the first optical sensor 10, the second optical sensor 20 operates along with the first optical sensor 10. In this case, data indicating the pulse width of the signal Qref may be stored in a memory, and a differential value between the pulse width indicated by stored data and the pulse width of the signal Q may be calculated. According to such a configuration, the second optical sensor 20 does not always operate along with the first optical sensor 10. Further, at this time, since the pulse width of the signal Qref can be changed according to temperature and so on, the pulse width of the signal Qref may be stored in the memory and updated at fixed intervals or by an instruction from the control circuit 40.

Figure 6:
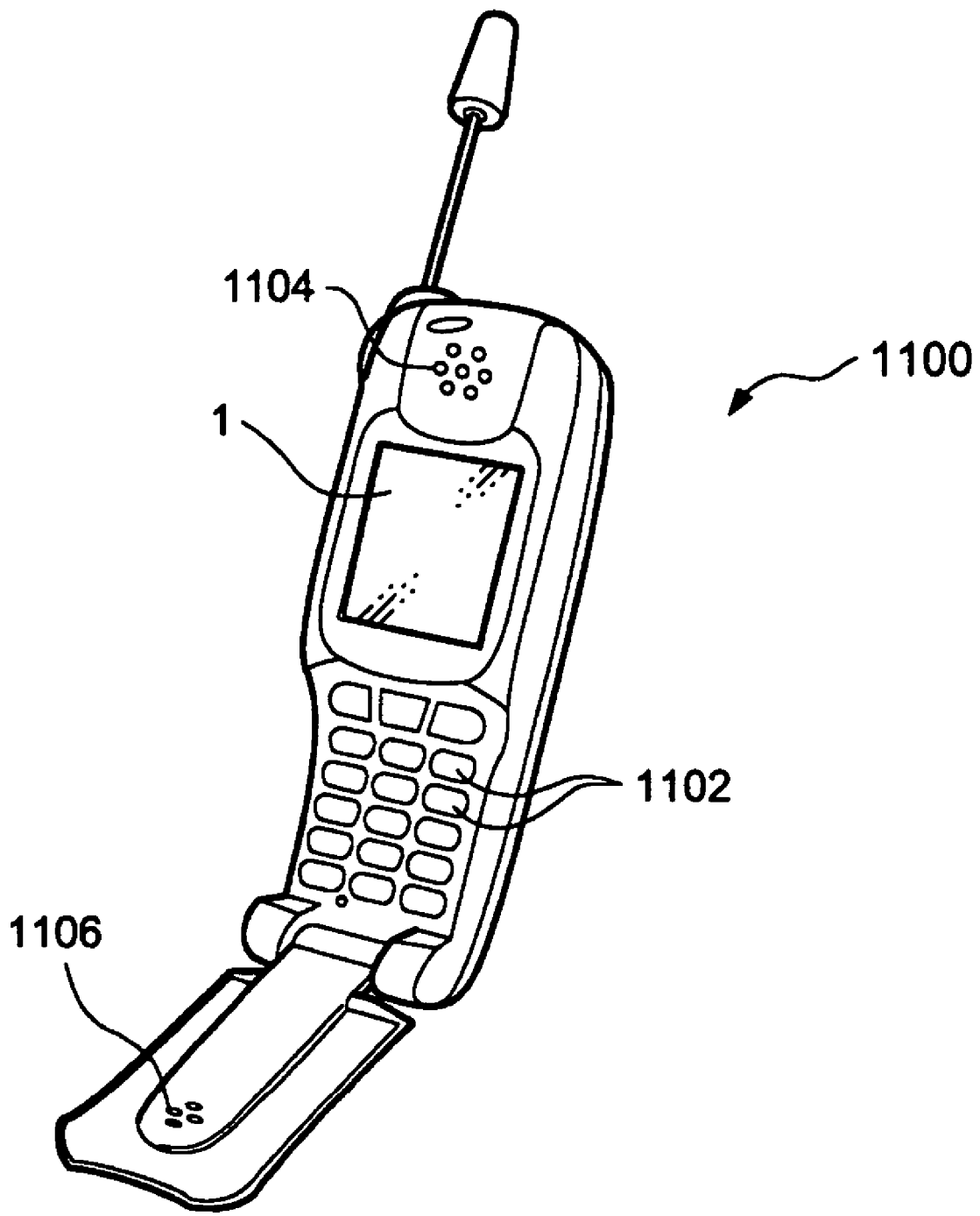
FIG. 6 is a perspective view showing a configuration of a cellular phone to which the display panel is applied.

Next, an electronic apparatus which uses the above-described liquid crystal display panel 1 as a display unit will be described. FIG. 6 is a perspective view showing a configuration of a cellular phone which is an example of the electrical apparatus.

In FIG. 6, a cellular phone 1100 has a plurality of operating buttons 1102, a receiver 1104, a transmitter 1106, and the above-described liquid crystal display panel 1 having the first optical sensor 10 and the second optical sensor 20 as a display unit.

According to such a configuration, since the optical sensors can be formed in the display panel, an additional opening portion or a mounting space for providing the light-receiving element is not required. Further, the amount of received light can be detected more accurately. As a result, an image can be more properly controlled according to environmental light.

Further, as an electronic apparatus, in addition to the cellular phone shown in FIG. 6, a digital still camera, a television, a viewfinder-type or monitor-direct-view-type video tape recorder, a car navigation device, a pager, an electronic organizer, an electronic calculator, a word processor, a workstation, a videophone, a POS terminal, and an apparatus having a touch panel may be exemplified. It is needless to say that the above-described liquid crystal display panel 1 can be used as the display units of these electronic apparatuses.

In the above-described embodiments, the liquid crystal display panel 1 is used. However, an organic EL element, an inorganic EL element, a field emission (FE) element, or other light-emitting elements such as LEDs may be used. Further, a display element such as an electrophoretic element, an electrochromic element, or the like may be used.

Further, the invention is not limited to a display panel of an electronic apparatus that directly displays an image or a character. For example, the invention can be applied to a light source of a printing apparatus which is used to indirectly form an image or a character by irradiating light onto a subject, for example, for a line head of an LED printer.

Besides, the display panel can have a configuration in which the pixel region is divided into a plurality of regions and a pair of sensors including the first optical sensor 10 and the second optical-sensor 20 is allocated for each divided region. In such a configuration, an image on the corresponding divided region can be controlled according to the allocated detection result.

What is claimed is:

1. An optical sensor circuit comprising:
    a first optical sensor that outputs a first signal according to the amount of received light on an opened light-receiving surface;
    a second optical sensor that is provided near the first optical sensor and outputs a second signal according to the amount of received light on a shielded light-receiving surface; and
    a difference calculating circuit that calculates a difference between the first signal and the second signal and outputs a signal calculated from the difference and the second signal.

2. The optical sensor circuit according to claim 1,
    wherein the first and second optical sensors output logical signals having pulse widths according to the amounts of received light respectively, and
    the difference calculating circuit has an EX-OR circuit that calculates an exclusive logical sum signal of the first signal and the second signal, an inverter that inverts the logical level of the second signal, a logic circuit that calculates an inverted logical product of the difference and the output of the inverter.

3. An electronic apparatus having the optical sensor circuit according to claim 1.

4. A method of processing an output signal of an optical sensor circuit which has a first optical sensor that outputs a first signal according to the amount of received light on an opened light-receiving surface, and a second optical sensor that is provided near the first optical sensor and outputs a second signal according to the amount of received light on a shielded light-receiving surface, the method comprising:
    calculating a difference between the first signal and the second signal; and
    outputting a signal calculated from the difference and the second signal.

* * * * *